(12) United States Patent
Managaki

(10) Patent No.: US 11,690,279 B2
(45) Date of Patent: Jun. 27, 2023

(54) SEMICONDUCTOR DEVICE AND MANUFACTURING METHOD THEREOF

(71) Applicant: Japan Display Inc., Tokyo (JP)

(72) Inventor: Nobuto Managaki, Tokyo (JP)

(73) Assignee: Japan Display Inc., Tokyo (JP)

(*) Notice: Subject to any disclaimer, the term of this patent is extended or adjusted under 35 U.S.C. 154(b) by 133 days.

(21) Appl. No.: 17/205,414

(22) Filed: Mar. 18, 2021

(65) Prior Publication Data

US 2021/0313525 A1  Oct. 7, 2021

(30) Foreign Application Priority Data

Apr. 2, 2020 (JP) ................. 2020-066472

(51) Int. Cl.

| | |
|---|---|
| *H10K 77/10* | (2023.01) |
| *B32B 27/08* | (2006.01) |
| *B32B 27/28* | (2006.01) |
| *H10K 59/12* | (2023.01) |
| *H10K 71/00* | (2023.01) |
| *H10K 102/00* | (2023.01) |

(52) U.S. Cl.
CPC ............ *H10K 77/111* (2023.02); *B32B 27/08* (2013.01); *B32B 27/281* (2013.01); *H10K 59/12* (2023.02); *H10K 71/00* (2023.02); *B32B 2255/10* (2013.01); *B32B 2255/26* (2013.01); *B32B 2307/418* (2013.01); *B32B 2457/20* (2013.01); *H10K 2102/311* (2023.02)

(58) Field of Classification Search
None
See application file for complete search history.

(56) References Cited

U.S. PATENT DOCUMENTS

| | | | |
|---|---|---|---|
| 2011/0260180 A1 | 10/2011 | Kuranaga et al. | |
| 2013/0181204 A1 | 7/2013 | Kuranaga et al. | |
| 2018/0351131 A1* | 12/2018 | Hiramatsu | ........... G09G 3/3208 |
| 2019/0013372 A1 | 1/2019 | Yasukawa et al. | |
| 2019/0341407 A1* | 11/2019 | Wang | ................... H01L 27/1288 |
| 2021/0159468 A1* | 5/2021 | Zhang | ..................... H01L 51/56 |
| 2021/0313525 A1* | 10/2021 | Managaki | ........... H01L 51/5275 |

FOREIGN PATENT DOCUMENTS

| | | |
|---|---|---|
| JP | 2011-227369 A | 11/2011 |
| JP | 2019-016504 A | 1/2019 |

* cited by examiner

*Primary Examiner* — J. E. Schoenholtz
(74) *Attorney, Agent, or Firm* — Michael Best & Friedrich LLP

(57) ABSTRACT

A semiconductor device includes: a resin substrate; a display element configured to generate an image; and a circuit layer including a thin film transistor configured to control the display element. The resin substrate has a main body made of resin and a surface layer made of the resin laminated on the main body. The surface layer has a lower electrification property than the main body or the surface layer has a lower film density than the main body. Each of the display element and the circuit layer is on the surface layer.

15 Claims, 7 Drawing Sheets

SEMICONDUCTOR DEVICE AND MANUFACTURING METHOD THEREOF

CROSS-REFERENCE TO RELATED APPLICATION

The present application claims priority from Japanese patent application JP2020-66472 filed on Apr. 2, 2020, the contents of which are hereby incorporated by reference into this application.

BACKGROUND

1. Field

The disclosure relates to a semiconductor device and a method of manufacturing the same.

2. Description of the Related Art

An organic electroluminescence display device has a light emitting layer configured to emit light in multiple gradations by passing a current corresponding to an input image signal, thereby displaying an image (JP 2019-16504A). The current is controlled by a thin film transistor.

JP 2011-227369A discloses a flexible display including a flexible resin substrate on which a thin film transistor is formed. Such a resin substrate, with its easily chargeable surface, tends to affect characteristics of the thin film transistor.

SUMMARY

The disclosure aims at suppressing electrification property of a resin substrate.

A semiconductor device includes: a resin substrate; a display element configured to generate an image; and a circuit layer including a thin film transistor configured to control the display element. The resin substrate has a main body made of resin and a surface layer made of the resin laminated on the main body. The surface layer has a lower electrification property than the main body or the surface layer has a lower film density than the main body. Each of the display element and the circuit layer is on the surface layer.

A method of manufacturing the semiconductor device includes: forming a resin substrate with a main body and a surface layer laminated on each other, through application of a resin and baking the resin, the surface layer having a lower electrification property or a lower film density than the main body; forming a circuit layer including a thin film transistor on a surface of the surface layer of the resin substrate; and forming a display layer on the circuit layer, the display layer including a display element configured to generate an image.

This can suppress the electrification property of the resin substrate, because of the lower electrification property or the lower film density.

DETAILED DESCRIPTION

Figure 1:
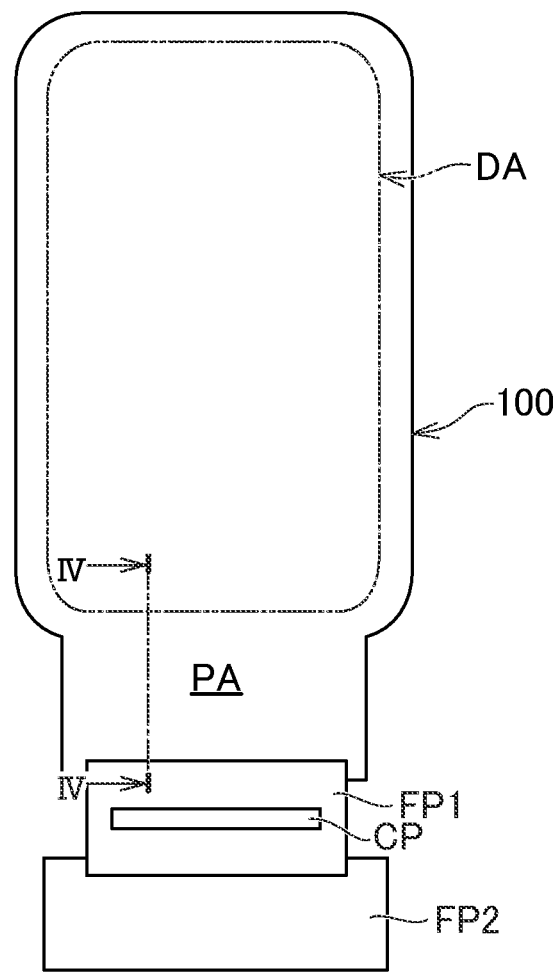
FIG. 1 is a plan view of a semiconductor device in a first embodiment.

Hereinafter, some embodiments will be described with reference to the drawings. Here, the invention can be embodied according to various aspects within the scope of the invention without departing from the gist of the invention and is not construed as being limited to the content described in the embodiments exemplified below.

The drawings are further schematically illustrated in widths, thickness, shapes, and the like of units than actual forms to further clarify description in some cases but are merely examples and do not limit interpretation of the invention. In the present specification and the drawings, the same reference numerals are given to elements having the same functions described in the previously described drawings and the repeated description will be omitted.

Further, in the detailed description, "on" or "under" in definition of positional relations of certain constituents and other constituents includes not only a case in which a constituent is located just on or just under a certain constituent but also a case in which another constituent is interposed between constituents unless otherwise mentioned.

First Embodiment

Figure 2:
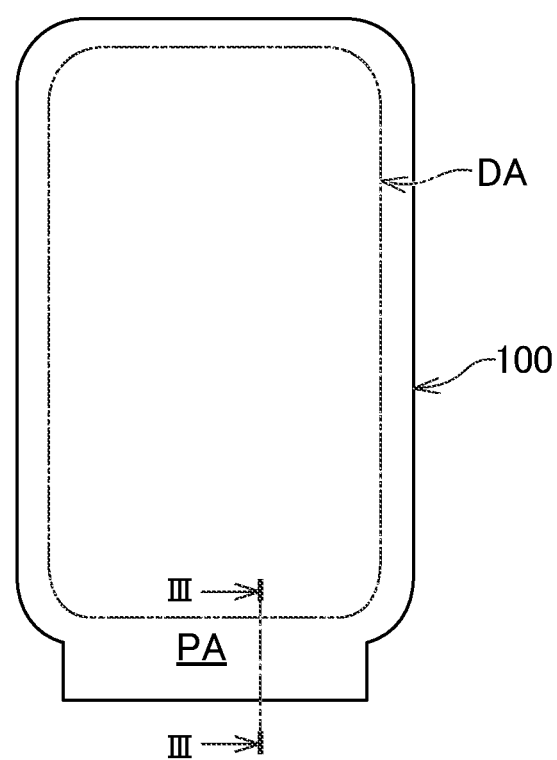
FIG. 2 is a schematic view of the semiconductor device being used.
Figure 3:
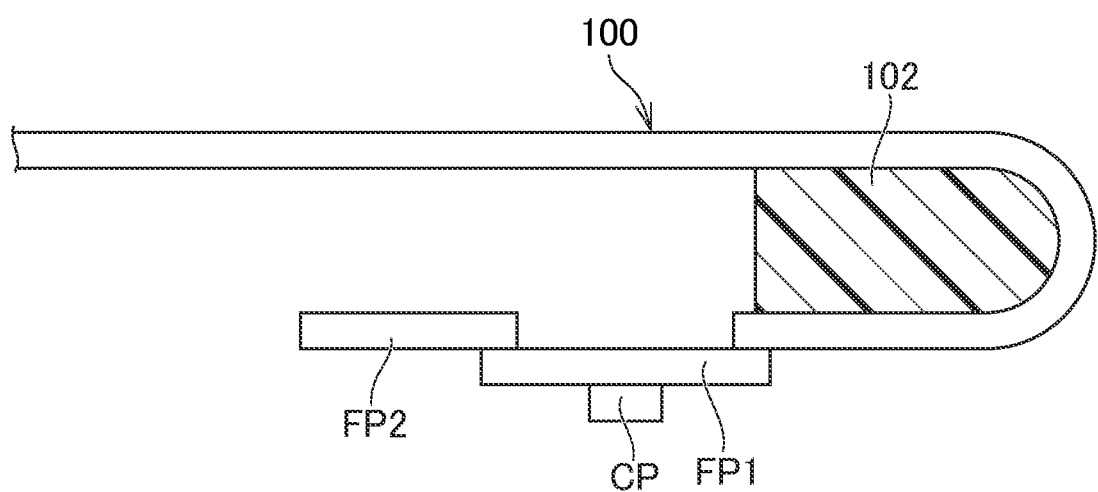
FIG. 3 is a III-III schematic cross-sectional view of the semiconductor device in FIG. 2.

FIG. 1 is a plan view of a semiconductor device in a first embodiment. The semiconductor device is actually bent and used. Therefore, FIG. 1 is a development view before the semiconductor device is bent. FIG. 2 is a schematic view of the semiconductor device being used. FIG. 3 is a III-III schematic cross-sectional view of the semiconductor device in FIG. 2.

The semiconductor device is, for example, an organic electroluminescence display device. The semiconductor device has a display area DA in which images are displayed. In the display area DA, for example, a plurality of unit pixels (sub-pixels) in some colors consisting of red, green, and blue are combined to form a full-color pixel, and a full-color image is displayed.

The semiconductor device includes a display 100. A spacer 102 is disposed inside the bend to prevent the display 100 from being bent too much. The display 100 is flexible and folded outside the display area DA (in a peripheral area PA). A first flexible printed circuit board FP1 is connected to the display 100 at the peripheral area PA. An integrated circuit chip CP, for driving elements to display images, is mounted on the first flexible printed circuit board FP1. Furthermore, a second flexible printed circuit board FP2 is connected to the first flexible printed circuit board FP1.

Figure 4:
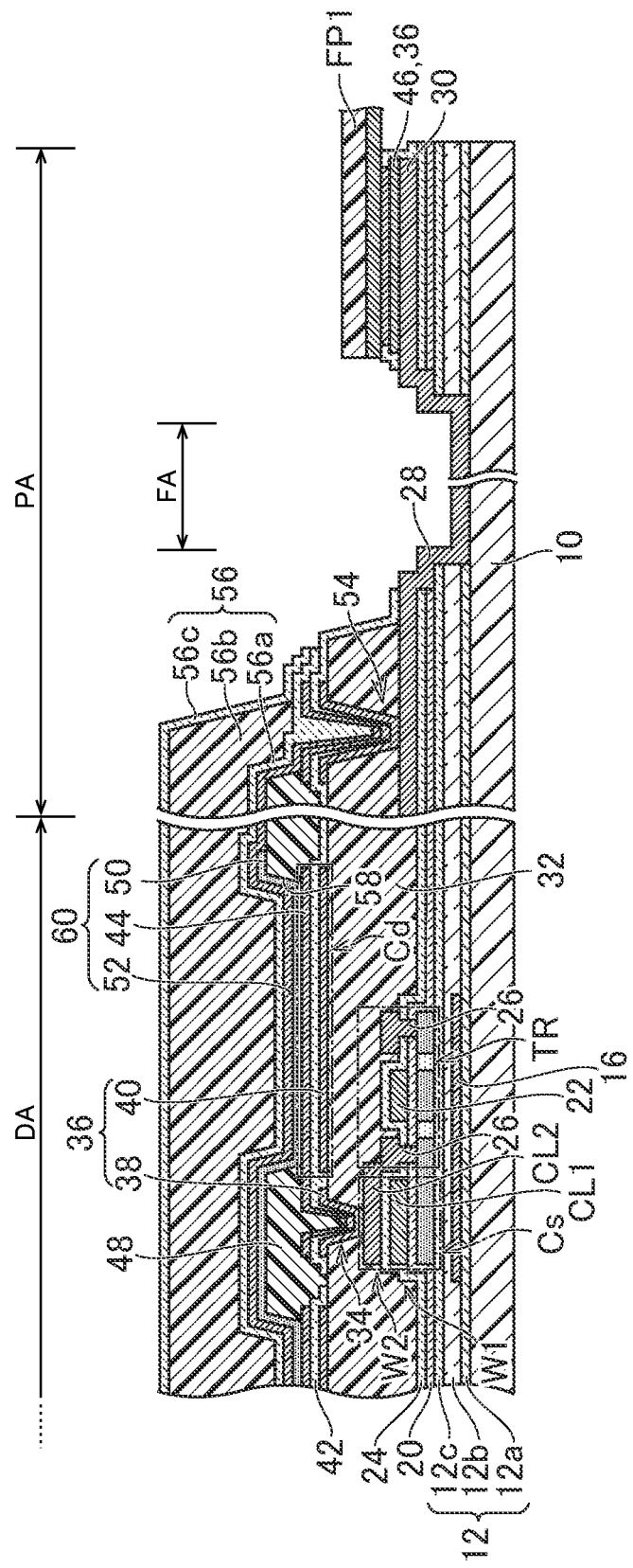
FIG. 4 is a IV-IV cross-sectional view of the semiconductor device in FIG. 1.

FIG. 4 is a IV-IV cross-sectional view of the semiconductor device in FIG. 1. The resin substrate 10 (array substrate) is made of polyimide. However, any other resin material may be used as long as it is a base material having sufficient flexibility for forming a sheet display or a flexible display.

On the resin substrate 10, a three-layer laminate structure of a silicon oxide film 12a, a silicon nitride film 12b, and a silicon oxide film 12c is provided as an undercoat layer 12. The lower most silicon oxide film 12a is provided for improving adhesion with the resin substrate 10, the middle silicon nitride film 12b is provided as a blocking film against moisture and impurities from the outside, and the uppermost silicon oxide film 12c is provided as a blocking film for preventing hydrogen atoms contained in the silicon nitride film 12b from diffusing to a semiconductor layer 18 of a thin film transistor TR; the structure is not specifically limited thereto, may further include a laminate, or may be a single layer or a double layer.

An additional film 16 may be formed under the undercoat layer 12 in accordance with a portion where a thin film transistor TR is to be formed. The additional film 16 can suppress change in characteristics of the thin film transistor TR due to penetration of light from the back surface of the channel, or can provide a predetermined potential by being formed from a conductive material to give a back gate effect to the thin film transistor TR. Here, after the silicon oxide film 12a is formed, the additional film 16 is formed in an island shape in accordance with the place where the thin film transistor TR is formed, and then the silicon nitride film 12b and the silicon oxide film 12c are laminated, so that the additional film 16 is sealed in the undercoat layer 12; the structure is not limited thereto, the additional film 16 may be formed first on the resin substrate 10, and then the undercoat layer 12 may be formed.

The thin film transistor TR is formed on the undercoat layer 12. A polysilicon thin film transistor is exemplified and only an N-channel transistor is shown here but a P-channel transistor may be formed at the same time. The semiconductor layer 18 of the thin film transistor TR has a structure in which a low concentration impurity region is provided between a channel region and a source/drain region. A silicon oxide film is used here as a gate insulating film 20. A gate electrode 22 is part of a first wiring layer W1 formed of molybdenum tungsten alloy. The first wiring layer W1 includes a first holding capacitance line CL1 in addition to the gate electrode 22. Between the first holding capacitance line CL1 and the semiconductor layer 18 (source/drain region), via the gate insulating film 20, part of the holding capacitance Cs is formed.

On the gate electrode 22, the interlayer insulation film (silicon oxide film, silicon nitride film) is laminated. To easily bend the resin substrate 10, at least part of the interlayer insulation film 24 should be removed in the folding area FA. The undercoat layer 12 is exposed by removing the interlayer insulation film 24, at least part thereof is also removed by patterning. After removing the undercoat layer 12, the resin material constituting the resin substrate 10 is exposed. In some cases, the surface of the resin material is partially eroded through etching of the undercoat layer 12, resulting in film reduction.

On the interlayer insulation film 24, a second wiring layer W2 is formed to include portions serving as the source/drain electrode 26 and a lead-out line 28. Here, it employs a three-layer laminated structure of titanium, aluminum, and titanium. Through the interlayer insulation film 24, the first holding capacitance line CL1 (part of the first wiring layer W1) and the second holding capacitance line CL2 (part of the second wiring layer W2) constitute another part of the holding capacitance Cs. The lead-out line 28 extends to an end of the resin substrate 10 and has a terminal 30 to be connected to the first flexible printed circuit board FP1.

A planarization film 32 is provided to cover the source/drain electrode 26 and the lead-out line 28 (except part of them). To form the planarization film 32, organic materials such as photosensitive acrylic are often used because of superiority in surface flatness compared to inorganic insulating materials formed by chemical vapor deposition (CVD).

The planarization film 32 is removed at a pixel contact portion 34 and in the peripheral area PA, and a transparent conductive film 36 made of, for example, indium tin oxide (ITO) is formed thereon. The transparent conductive film 36 includes a first transparent conductive film 38 and a second transparent conductive film 40 that are separated from each other.

The second wiring layer W2, the surface of which is exposed by the removal of the planarization film 32, is covered with the first transparent conductive film 38. A silicon nitride film 42 is provided on the planarization film 32, covering the first transparent conductive film 38. The silicon nitride film 42 has an opening at the pixel contact portion 34; a pixel electrode 44 is laminated and electrically connected to the source/drain electrode 26 through the opening. The pixel electrode 44 is formed as a reflective electrode, and has a three-layer laminated structure of an indium zinc oxide film, a silver film, and an indium zinc oxide film. Here, the indium zinc oxide film may be replaced with a transparent conductive film. The pixel electrode 44 extends laterally from the pixel contact portion 34, leading to above the thin film transistor TR.

The second transparent conductive film 40 is disposed adjacent to the pixel contact portion 34 and below the pixel electrode 44 (further below the silicon nitride film 42). The second transparent conductive film 40, the silicon nitride film 42, and the pixel electrode 44 are overlapped, thereby forming an additional capacitance Cd.

A third transparent conductive film 46 that is another part of the transparent conductive film 36 is formed on a surface of the terminal 30. The third transparent conductive film 46 is formed simultaneously with the first transparent conductive film 38 and the second transparent conductive film 40. The third transparent conductive film 46 on the terminal 30 is intended to be provided as a barrier film so that the exposed portion of the terminal 30 is not damaged in subsequent processes. During the patterning process of the pixel electrode 44, the third transparent conductive film 46 is exposed to an etching environment, but the transparent conductive film 36 is sufficiently made resistant to the etching of the pixel electrode 44 by an annealing process performed during a period from the formation of the transparent conductive film 36 to the formation of the pixel electrode 44.

Above the planarization film 32, for example, above the pixel contact portion 34, an insulating layer 48, serving as a partition wall of adjacent pixel regions and being called a bank (rib), is formed. To form the insulating layer 48, photosensitive acrylic may be used like the planarization film 32. The insulating layer 48 has an opening 58 to expose the surface of the pixel electrode 44 for a light emitting region; the opening 58 should have an end in a gently tapered shape. With the end of the opening 58 in a steep shape, the coverage of the film formed thereon is defective. The insulating layer 48 rests on a periphery of each pixel electrode 44.

The planarization film 32 and the insulating layer 48 are in contact with each other through an opening in the silicon nitride film 42 between them. As a result, moisture and gas desorbed from the planarization film 32 can be extracted through the insulating layer 48 during heat treatment after the insulating layer 48 is formed.

An electroluminescent layer 50 made of an organic material is laminated on the pixel electrode 44. The electroluminescent layer 50 also rests on a top surface of the insulating layer 48. A counter electrode 52 is provided on the electroluminescent layer 50. Here, a top emission structure is employed; the counter electrode 52 is transparent. For example, a magnesium layer and a silver layer are formed so thin as to transmit light emitted from the electroluminescent layer 50. According to the order of formation of the electroluminescent layer 50 described above, the pixel electrode 44 is an anode and the counter electrode 52 is a cathode.

The counter electrode 52 is on the display area DA, extends to a cathode contact portion 54 near the display area DA, is connected to the lower lead-out line 28 at the cathode contact portion 54, and is electrically connected to the terminal 30.

A sealing film 56 is formed on the counter electrode 52. The sealing film 56 has a function of preventing external moisture from entering the electroluminescent layer 50 that has formed, requiring a high gas barrier property. Here, to form a laminated structure including a silicon nitride film, a silicon nitride film 56a, a resin film 56b, and a silicon nitride film 56c are laminated. A silicon oxide film or an amorphous silicon layer may be provided between the silicon nitride films 56a, 56c and the resin film 56b for improving adhesion.

If necessary, a cover glass or a touch panel substrate may be provided on the sealing film 56. In this case, a filler material using a resin may be interposed to fill a gap between the sealing film 56 and the cover glass or the touch panel.

The semiconductor device includes a display element 60 (pixel electrode 44, electroluminescent layer 50, counter electrode 52) for generating images. The semiconductor device has a circuit layer. The circuit layer includes a thin film transistor TR for controlling the display element 60.

Figure 5:
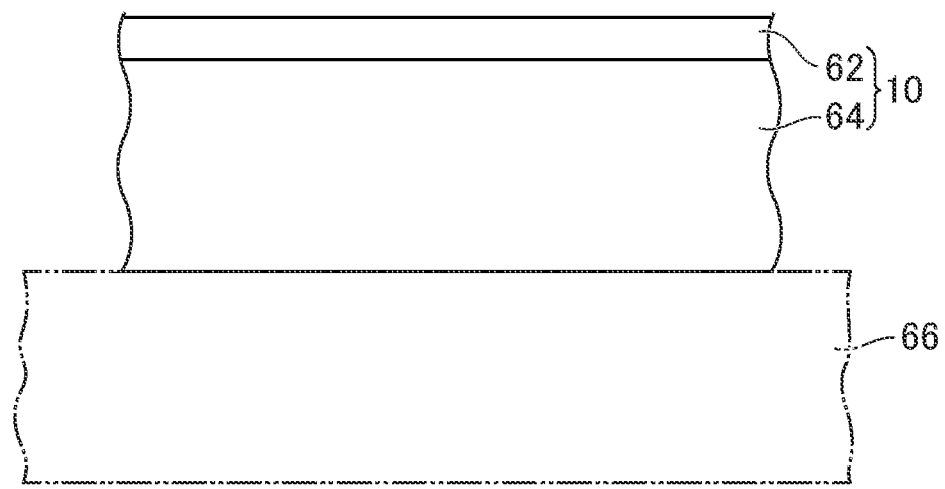
FIG. 5 is a detailed view of a resin substrate in the first embodiment.

FIG. 5 is a detailed view of the resin substrate in the first embodiment. The resin substrate 10 includes a main body 64 made of resin. The refractive index of the main body 64 is at least 3.08 and at most 3.17. The filling rate of the main body 64 is at least 97 percent and at most 100 percent. The imidization rate of the main body 64 is at least 99 percent and at most 100 percent.

The main body 64 is made of a polyimide comprising pyromellitic dianhydride (PMDA, also known as enzene-1,2,4,5-tetracarboxylic dianhydride). This is, for example, one in which PMDA and oxydianiline (ODA, also known as 3,4'-diaminodiphenyl ether) are repeatedly multiple bonded by an imide bond. Due to hardness compared to biphenyl and stretching characteristics similar to polyimide tape, the pyromellitic anhydride is extremely robust but has a high electrification property.

The resin substrate 10 includes a surface layer 62 made of resin. The surface layer 62 is laminated on the main body 64. The circuit layer is formed on a surface of the surface layer 62. The surface layer 62 has a lower electrification property than the main body 64.

According to this embodiment, the surface layer 62 with the low electrification property can suppress the electrification in the vicinity of the interface between the resin substrate 10 and the circuit layer. Specifically, the suppression of the electrification of the surface layer 62 leads to suppression of the electrification of the undercoat layer 12 that is an insulating film such as SiN or SiO laminated thereon, resulting in reduction of leakage current flowing between adjacent thin film transistors TR, through surface states formed as a result. Further, by suppressing the electrification of the surface layer 62, the occurrence of dielectric breakdown can be suppressed, whereby the occurrence of leakage paths from the thin film transistor TR to the resin substrate 10 is suppressed. Alternatively, by suppressing the electrification of the surface layer 62, the shift of the threshold voltage of the thin film transistor TR is suppressed, thereby reducing an apparent current leakage.

The refractive index of the surface layer 62 is at least 3.00 and less than 3.08. The filling rate of the surface layer is at least 92 percent and less than 97 percent. The imidization rate of the surface layer 62 is less than 99 percent. The surface layer 62 is made of polyimide containing diphenylene. The surface layer 62 has a poorer orientation in the film thickness direction than the main body 64. The X-ray diffractive (XRD) strength ratio of the surface layer 62 to the main body 64 is 0.8 or less.

The inventor has found that, by forming the surface layer 62 constituting the surface of the resin substrate 10 so as to have a low filling ratio and a low imidization ratio as described above, the electrification property thereof can be suppressed more than that of the resin forming the main body 64. Here, as a result of the low filling ratio and the low imidization, the film density of the surface layer 62 is lower than that of the main body 64.

The resin substrate 10 is formed by laminating the main body 64 and the surface layer 62. The resin substrate 10 may be formed of an acrylic resin or an epoxy resin, instead of polyimide. The resin substrate 10 is formed through resin coating and resin baking. The resin substrate 10 is formed so that the surface layer 62 has a lower electrification property than the main body 64.

The processes of forming the resin substrate 10 include coating a resin for forming the main body 64. For example, the resin is applied to a working plate 66 such as a glass plate. Then, the resin for forming the main body 64 is baked. The baking is carried out by amplification of molecular motion (e.g., by infrared radiation) at a first temperature (e.g., 500° C.) Incidentally, the main body 64 has its lower surface (interface with the working plate 66), where molecules of the resin are uniformly oriented.

The processes of forming the resin substrate 10 include coating and baking of a resin for forming the surface layer 62. The surface layer 62 is formed to have a thickness of at most half (e.g., at most 20 percent) of the resin substrate 10. The resin for forming the surface layer 62 is baked by applying hot air. By using the hot air, the solvent evaporates near the surface but hardly evaporates inside. Alternatively, the baking is performed at a second temperature (e.g., 450° C.) lower than the first temperature. This can lower the electrification property of the surface layer 62.

Figure 6:
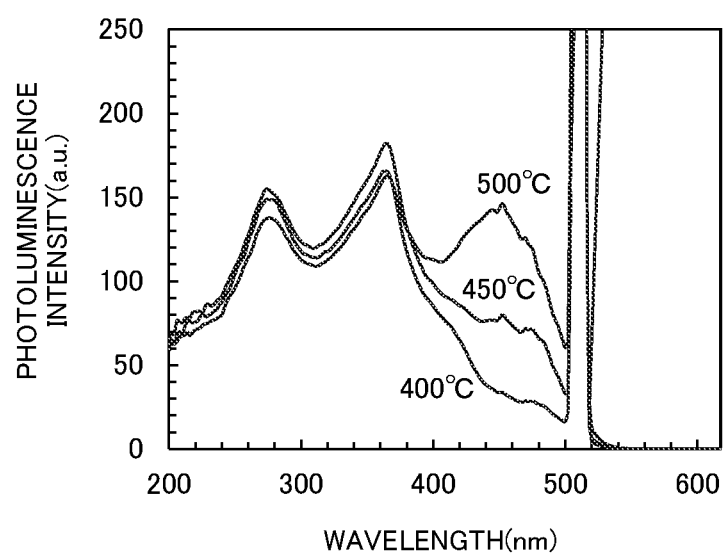
FIG. 6 is a diagram of electrification characteristics of polyimide.

FIG. 6 is a diagram of electrification characteristics of polyimide. The horizontal axis indicates the wavelength of light irradiated to the polyimide. The vertical axis indicates the photoluminescence intensity. At the light wavelengths of 400-500 nm, the photoluminescence intensity corresponds to magnitude of charge, conductivity, and electrification. The photoluminescence intensity is higher in the order of the baking temperatures of 500° C., 450° C., and 400° C. That is, it is understood that the lower the baking temperature is, the lower the electrification property becomes.

The circuit layer including the thin film transistor TR in FIG. 4 is formed on the surface of the surface layer 62 of the resin substrate 10. The display element 60 for generating images is formed over the circuit layer. Finally, the semiconductor device is obtained by peeling the working plate 66 in FIG. 5.

Second Embodiment

Figure 7:
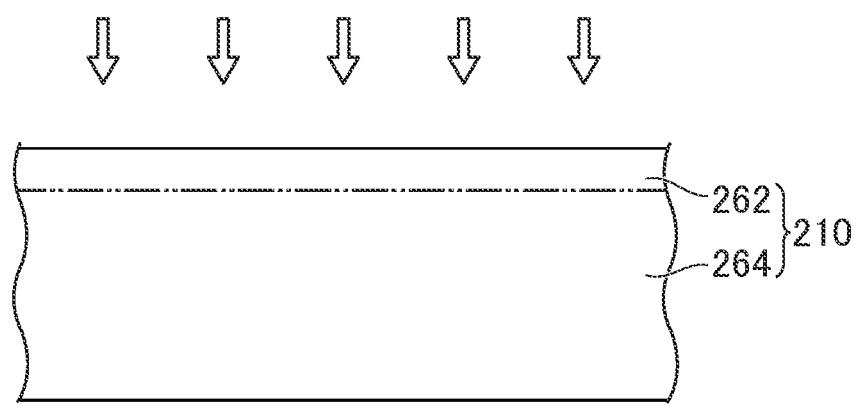
FIG. 7 is a diagram of a method of manufacturing a semiconductor device in a second embodiment.

FIG. 7 is a diagram for a method of manufacturing a semiconductor device in a second embodiment.

In this embodiment, a resin is collectively applied as a material of both the main body 264 and the surface layer 262. Subsequently, during the baking of the resin, the main body 264 is heated, for example at 500° C., by amplification of molecular motion of the main body 264 (e.g., by infrared radiation). The infrared radiation can heat the object from below. Then, the surface layer 262 is heated at a lower temperature (e.g., 450° C.) than the main body 264, by transferring heat from the main body 264. Also in this embodiment, the electrification property of the surface layer 262 is low, thereby suppressing the electrification property of the resin substrate 210. With respect to other points, what is described in the first embodiment is applicable to this embodiment.

The main body 264 and the surface layer 262 may be formed to have a vertical relationship, by preparing and applying a base material obtained by mixing different materials, and by utilizing layer separation between the different materials until the applied resin layer is cured.

The embodiments described above are not limited and different variations are possible. The structures explained in the embodiment may be replaced with substantially the same structures and other structures that can achieve the same effect or the same objective.

Further, the present invention has the same effect in the manufacture of a semiconductor device in which other display elements not limited to organic EL elements and various functional elements not limited to display elements (specifically, e.g., light receiving element, detection element) are formed on a substrate made of resin.

What is claimed is:

1. A semiconductor device comprising:
   a resin substrate;
   a display element configured to generate an image; and
   a circuit layer including a thin film transistor configured to control the display element,
   wherein the resin substrate has a main body made of resin and a surface layer made of the resin laminated on the main body,
   the surface layer has a lower electrification property than the main body or the surface layer has a lower film density than the main body,
   each of the display element and the circuit layer is on the surface layer,
   the main body is made of polyimide containing pyromellitic anhydride, and
   the surface layer is made of polyimide containing diphenylene.

2. The semiconductor device according to claim 1, wherein
   the main body has a refractive index of at least 3.08 and at most 3.17, and
   the surface layer has a refractive index of at least 3.00 and less than 3.08.

3. The semiconductor device according to claim 1, wherein
   the main body has a filling rate of at least 97 percent and at most 100 percent, and
   the surface layer has a filling rate of at least 92 percent and less than 97 percent.

4. The semiconductor device according to claim 1, wherein
   the main body has an imidization rate of at least 99 percent and at most 100 percent, and
   the surface layer has an imidization rate of less than 99 percent.

5. The semiconductor device according to claim 1, wherein the main body has a greater orientation in a film thickness direction than the surface layer.

6. The semiconductor device according to claim 1, wherein the surface layer has an X-ray diffraction intensity ratio of 0.8 or less to the main body.

7. The semiconductor device according to claim 1, wherein the resin substrate has molecules of the resin in a uniform orientation on a surface opposite to the surface layer.

8. The semiconductor device according to claim 1, wherein the surface layer is at most half as large in film thickness as the resin substrate.

9. A method of manufacturing the semiconductor device, the method comprising:
   forming a resin substrate with a main body and a surface layer laminated on each other, through applying and baking a resin, the surface layer having a lower electrification property or a lower film density than the main body;
   forming a circuit layer including a thin film transistor on a surface of the surface layer of the resin substrate; and
   forming a display layer on the circuit layer, the display layer including a display element configured to generate an image, wherein
   the main body is formed of polyimide containing pyromellitic anhydride, and the surface layer is formed of polyimide containing diphenylene.

10. The method of manufacturing the semiconductor device according to claim 9, wherein in the step of forming the resin substrate, applying and baking a portion of the resin for forming the main body and applying and baking another portion of the resin for forming the surface layer are separately carried out.

11. The method of manufacturing the semiconductor device according to claim 9, wherein
   a portion of the resin for forming the main body is baked by amplification of molecular motion, and
   another portion of the resin for forming the surface layer is baked by applying hot air.

12. The method of manufacturing the semiconductor device according to claim 9, wherein
   a portion of the resin for forming the main body is baked at a first temperature, and
   another portion of the resin for forming the surface layer is baked at a second temperature lower than the first temperature.

13. The method of manufacturing the semiconductor device according to claim 9, wherein the surface layer is formed to be at most half as large in film thickness as the resin substrate.

14. The method of manufacturing the semiconductor device according to claim 12, wherein the surface layer is formed to be at most 20 percent as large in film thickness as the resin substrate.

15. The method of manufacturing the semiconductor device according to claim 9, wherein
   in the step of applying the resin, the resin is collectively applied as a material of both the main body and the surface layer, and
   in the step of baking the resin, the main body is heated by amplifying molecular motion of the main body, and heat is transferred from the main body to the surface layer, thereby heating the surface layer at a lower temperature than the main body.

* * * * *